(12) United States Patent
Wang et al.

(10) Patent No.: US 10,412,278 B2
(45) Date of Patent: *Sep. 10, 2019

(54) SYSTEM-LEVEL CAMERA MODULE WITH ELECTRICAL SUPPORT AND MANUFACTURING METHOD THEREOF

(71) Applicant: NINGBO SUNNY OPOTECH CO., LTD., Ningbo, Zhejiang (CN)

(72) Inventors: Mingzhu Wang, Ningbo (CN); Bojie Zhao, Ningbo (CN); Feifan Chen, Ningbo (CN); Liang Ding, Ningbo (CN); Nan Guo, Ningbo (CN); Ye Wu, Ningbo (CN); Heng Jiang, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 263 days.

This patent is subject to a terminal disclaimer.

(21) Appl. No.: 15/057,063

(22) Filed: Feb. 29, 2016

(65) Prior Publication Data

US 2017/0142304 A1    May 18, 2017

(30) Foreign Application Priority Data

Nov. 13, 2015 (CN) .......................... 2015 1 0778437
Feb. 23, 2016 (CN) .......................... 2016 1 0099510

(51) Int. Cl.
*H04N 5/225* (2006.01)

(52) U.S. Cl.
CPC ......... *H04N 5/2253* (2013.01); *H04N 5/2252* (2013.01)

(58) Field of Classification Search
CPC .. H01L 27/146–14893; G02B 7/02–16; H04N 5/374–37457
USPC ...... 396/520; 348/374, 340, 357; 250/208.1; 257/225–234, 257, 258, 291–294, 257/431–448
See application file for complete search history.

(56) References Cited

U.S. PATENT DOCUMENTS

| | | | |
|---|---|---|---|
| 2004/0113048 A1* | 6/2004 | Tu | H01L 27/14618 250/208.1 |
| 2006/0208182 A1* | 9/2006 | Tsukamoto | H01L 27/14618 250/239 |
| 2007/0183773 A1* | 8/2007 | Aoki | G03B 17/02 396/529 |
| 2011/0043883 A1* | 2/2011 | Lin | G02B 5/005 359/230 |
| 2011/0221956 A1* | 9/2011 | Sekine | H04N 5/2253 348/374 |
| 2011/0304754 A1* | 12/2011 | Tsai | H01L 27/14618 348/294 |

(Continued)

*Primary Examiner* — Xi Wang
(74) *Attorney, Agent, or Firm* — Raymond Y. Chan; David and Raymond Patent Firm

(57) ABSTRACT

A camera module includes an optical lens, a photosensitive chip and an electrical support. The electrical support includes a circuit module embedded in a support body to form an integral structure, a connecting member provided on the support body to electrically connect with the circuit module, and a camera component coupled at the support body and electrically connected to the connecting member. Therefore, the electrical support not only forms a circuit board to electrically connect with the camera component but only serves as a base to support the camera component.

4 Claims, 13 Drawing Sheets

(56) References Cited

U.S. PATENT DOCUMENTS

2013/0107112 A1* 5/2013 Oh ..................... H04N 5/2251
348/374

* cited by examiner

SYSTEM-LEVEL CAMERA MODULE WITH ELECTRICAL SUPPORT AND MANUFACTURING METHOD THEREOF

CROSS REFERENCE OF RELATED APPLICATION

This is a Continuation application that claims the benefit of priority under 35 U.S.C. § 119 to a non-provisional application, application Ser. No. 15/057,057, filed Feb. 29, 2016, and the benefit of priority under 35 U.S.C. § 120 to Chinese application number CN 201510778437.2, filing date Nov. 13, 2015, and Chinese application number CN 201610099510.8, filing data Feb. 23, 2016, the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a camera module, and more particularly relates to a system-level camera module with electrical support and the manufacturing method thereof.

Description of Related Arts

Conventional mobile phone camera module utilizes chip-scale package technology (CSP) or chip-on-board assembly technology (COB), in which each electronic component is placed on the surface of the circuit board, which does not overlap each other between the electronic components. In an autofocus camera module, in order to protect the chip which is placed on the surface of the circuit board, the support is often needed to protect the internal components and to support the driver. With the increasing demand of camera module pixel accuracy and function, the use of different drivers, resistors, capacitors and other electronic components will be correspondingly increased, which will result in the increase of the chip area and the increasing packaging size of the camera module. On the other hand, the demand for camera module has not limited to its functionality and improved pixel accuracy. As the portable electronic devices become vital products in everyday life, the demand and supply of the portable electronic device for the manufacturers and consumers is relatively high. Accordingly, the requirements for the camera module are increasing.

Currently, the design for portable electronic devices, such as smart phones and tablet PCs, has shown a general tendency toward lightness and thinness, which requires various compact sized components of the portable electronic device (especially refers to the thickness of the components) to be more compact by further reducing the sizes thereof. For example, the camera module as a standard component in a portable electronic device has tendency toward lightness and thinness to be installed in the portable electronic device.

Existing mobile phone module package is conflict with the trend of phone camera module with its thinness and miniaturization features, it is necessary to invent a new type of compact packaging technology to meet the demands of product development.

Referring to FIG. 1, a camera module in a prior art is illustrated, wherein the camera module comprises an optical lens 1, a motor 2, an optical filter 3 such as a IR filter, a base holder 4, at least one metal wire 5, a drive control member 6, a circuit board 7, a photosensitive chip 8, at least one driver solder joint 9 and a conductor used for electrically connecting the motor 2 and the circuit board 7. The photosensitive chip 8 is attached on the top surface of the circuit board 7. The metal wire 5, such as copper wire, is used to connect the photosensitive chip 8 and the circuit board 7 by wire bonding. The optical filter 3 is attached to the base 3 or the optical lens 1. After the camera module is assembled, the driver pins are soldered in order to electrically connect to the motor 2 and the circuit board 7. So, the circuit board 7 can provide power to the motor 2 and further control the operation of the motor 2.

Although such camera module has been widely used in the market, this camera module still has many drawbacks.

Firstly, the driver 2 has a protruded conductor which is electrically connected to the circuit board 7, so that the motor 2 is electrically connected to the circuit board 7. The conductor is connected to the circuit board 7 through the solder joint 9. The process to connect the motor 2 and the circuit board 7 through a protruded conductor is complicated, and will generate many other problems, such as the product quality might be influenced by the soldering quality. Moreover, this soldering connection by soldering the protruded conductor is not solid, which would be easily damaged during operation or maintenance process.

Furthermore, the circuit board 7 and the photosensitive chip 8 are connected by the metal wire 5. Such electrical connection is not secured. In addition, the base holder 4 needs to provide a relative large protection space for the metal wire 5 to be securely set. In other words, the size of the base holder 4 will be enlarged. Accordingly, the size of the entire camera module will also be enlarged.

Furthermore, the conductor, the metal wire 5 and the drive control module 6 are vulnerable to external environment, such as the dust, etc., so as to affect the quality of the entire camera module and to reduce the service life of the entire camera module.

As mentioned above, the connection between the circuit board 7 and the photosensitive chip 8 together with the connection between the motor 2 and the circuit board 7 that both takes certain large space and are difficult to get good protection. At the same time, the base holder 4 has a large size to be connected with the circuit board 7, the photosensitive chip 8 and the holder 2. However, it can achieve electrical connection between the circuit board 7 and the motor 2 and between the circuit board 7 and the photosensitive motor 8. In addition, the base holder 4 is hardly able to provide enough protection to other electronic components in the camera module. It cannot provide a full protection from dust or other contaminants.

A new camera module to meets the development requirement of the portable electronic product with higher performance and better structure layout is needed.

SUMMARY OF THE PRESENT INVENTION

One objective of the present invention is to provide a camera module with electrical support and manufacturing method thereof, wherein the camera module of the present invention does not require any conventional base holder that is one of the main components of the conventional camera module.

Another objective of the present invention is to provide a camera module with electrical support and manufacturing method thereof, wherein the camera module comprises an electrical support, wherein the electrical support as a multipurpose support can be any predetermined shape, which not only serves as a conventional circuit board to electrically connect with different camera components, such as electrical conduction for chips, drivers and other electronic components, but also serves as a conventional base holder to support the camera components, such as the photosensitive chip, the optical filter and the driver.

Another object of the present invention is to provide a camera module with electrical support and manufacturing method thereof, wherein the electrical support integrates with the functions of the base and the circuit board in conventional camera module to minimize unnecessary components thereof so as to enhance the structure of camera module to be more compact than the conventional one.

Another object of the present invention is to provide a camera module with electrical support and manufacturing method thereof, wherein all components are arranged in an organized manner to simply the manufacturing process of the camera module.

Another object of the present invention is to provide a camera module with electrical support and manufacturing method thereof, wherein the metal piece of the electrical support is interconnected, when the driver is attached to the electrical support, the circuit board of the camera module is able to connect with the driver directly, such as using conductive adhesive to substitute the soldering process of driver mounting to the circuit process.

Another object of the present invention is to provide a camera module with electrical support and manufacturing method thereof, wherein the camera module is suitable for flip chip method, wherein the photosensitive sensor of the camera module can be attached to the electrical support using flip chip method without the wire bonding process.

Another object of the present invention is to provide a camera module with electrical support and manufacturing method thereof, wherein the connecting method of the photosensitive sensor and the photosensitive sensor pad of the camera module can be but not limited to ACP (anisotropic conductive paste), ultrasonic welding, thermo-compression bonding, reflow soldering, and etc.

Another object of the present invention is to provide a camera module with electrical support and the manufacturing method thereof, wherein the electrical support can embed with resistors, capacitors, IC and other electronic components.

Another object of the present invention is to provide a camera module with electrical support and the manufacturing method thereof, wherein the resistors, capacitors and other electronic components of the camera module are embedded in the electrical support which can prevent the module getting dirty from solder resist, dust, etc. so as to efficiently improve the product quality.

Another object of the present invention is to provide a camera module with electrical support and the manufacturing method thereof, wherein the production of the camera module can use imposition manner which is suitable for high efficient massive production.

Another object of the present invention is to provide a camera module with electrical support and the manufacturing method thereof, wherein the electrical support substitutes the base in conventional camera module which can reduce the inclination of module caused by the base so as to improve the product quality.

Another object of the present invention is to provide a camera module with electrical support and the manufacturing method thereof, wherein the camera module has a small size and a securely connecting structure.

Another object of the present invention is to provide a camera module with electrical support and the manufacturing method thereof, wherein the camera module has a small overall dimension, wherein the height of the camera module can be reduced 0.25 mm comparing with the conventional COB packaging method and the overall dimensions can be reduced more than 0.5 mm.

Another object of the present invention is to provide a camera module with electrical support and the manufacturing method thereof, wherein the camera module manufacturing process is simplified, wherein the driver is directly attached to the circuit board, which reduces the soldering process, shorten the production cycle and reduces production costs.

Another object of the present invention is to provide a camera module with electrical support and the manufacturing method thereof, wherein the electrical support has strong market competitiveness, thus enhance the market competitiveness of the camera module using the electrical support, and further enhance the market competitiveness of the electronic equipment using the camera module in high-end products market.

Additional advantages and features of the invention will become apparent from the description which follows, and may be realized by means of the instrumentalities and combinations particular point out in the appended claims.

According to the present invention, the foregoing and other objects and advantages are attained by an electrical support, wherein the electrical support is used on a camera module. The electrical module comprises a support body and a circuit arrangement, wherein the circuit arrangement is provided on the support body to form an integral structure, wherein the electrical support integrated the base and the circuit board in conventional camera module.

In one embodiment, the circuit arrangement is embedded in the support body.

In one embodiment, the circuit arrangement comprises at least a conductive member and at least an electronic component, wherein the conductive member is electrically connected with the electronic component in a default method.

In one embodiment, the support body further comprises at least a connecting element which is electrically connected to the conductive member and the electronic component.

In one embodiment, the connecting element is provided on the surface of the support body.

In one embodiment, the connecting element further comprises at least a photosensitive sensor conductive member which is used in the camera module to electrically connect the photosensitive sensor with the conductive member and the electronic component.

In one embodiment, the photosensitive sensor conductive member is embodied as a photosensitive sensor terminal.

In one embodiment, the connecting element further comprises at least a driver conductive member which is used in the driver of the camera module to electrically connect the driver with the conductive member and the electronic component.

In one embodiment, the driver conductive member is embodied as a driver terminal.

In one embodiment, the connecting element further comprises at least a flexible PCB conductive member which is used in a flexible PCB of the camera module to electrically connect the flexible PCB with the conductive member and the electronic component.

In one embodiment, the flexible PCB conductive member is embodied as a flexible PCB terminal.

In one embodiment, the electrical support further comprises at least an electrical component, and the connecting element further comprises at least an electrical conductive member which is used to electrically connect the electrical component with the conductive member and the electronic component.

In one embodiment, the electrical conductive member is embodied as an electrical member terminal.

In one embodiment, the support body has a first top surface, a first bottom surface, a second top surface and a second bottom surface, wherein the connecting element is provided on each of the first top surface, the first bottom surface, the second top surface and the second bottom surface of the support body.

In one embodiment, the driver conductive member is provided on the second top surface.

In one embodiment, the photosensitive sensor conductive member is provided on the first bottom surface.

In one embodiment, the flexible PCB conductive member is provided on the second bottom surface.

In one embodiment, the flexible PCB conductive member is provided on the second top surface.

In one embodiment, the electrical component and the electrical conductive member are provided on the first top surface.

In one embodiment, the electrical support comprise a top recess, a through hole and a bottom recess, wherein the top recess and the bottom recess are used for assembling an optical filter and a photosensitive sensor of the camera module.

In one embodiment, the support body comprises a first support member and a second support member. The first support member has the first top surface and the first bottom surface. The second support member has the second top surface and the second bottom surface. The first top surface is indented from the second top surface.

In one embodiment, the first top surface is on the same plane with the second top surface.

In one embodiment, the first bottom surface is indent from the second bottom surface.

In one embodiment, the first bottom surface is on the same plane with the second bottom surface.

In one embodiment, wherein the support body has a through hole, wherein the photosensitive sensor and the filter lens are mounted on the opposite side of the camera module respectively.

In accordance with another aspect of the invention, the present invention comprises a camera module which further comprises:
an optical lens,
a photosensitive sensor; and
an electrical support;
wherein the optical lens is located along an photosensitive path of the photosensitive sensor, and the electrical support supports the photosensitive sensor.

In one embodiment, the camera module further comprises a driver, wherein the optical lens is provided at the driver.

In one embodiment, the photosensitive sensor is electrically connected to the circuit arrangement of the electrical support.

In one embodiment, the camera module further comprises an optical filter, wherein the optical filter is provided between the optical lens and the photosensitive sensor.

In one embodiment, the driver is soldered to or attached to the electrical support.

In one embodiment, the photosensitive sensor is provided on the bottom side of the support body of the electrical support and electrically connected to the circuit arrangement of the electrical support. The photosensitive sensor is assembled by using flip chip method.

In one embodiment, the photosensitive sensor and the electrical support are assembled using all possible methods such as ACP (anisotropic conductive paste), ultrasonic welding, thermo-compression bonding and reflow soldering.

In one embodiment, the camera module further comprises a flexible PCB, wherein the flexible PCB is provided on the top side or the bottom side of the support body of the electrical support, wherein the flexible PCB is electrically connected to the circuit arrangement of the electrical support.

In accordance with another aspect of the invention, the present invention comprises a manufacturing method of a camera module, which comprises the steps of:

(a) supporting a photosensitive sensor at an electrical support; and (b) supporting an optical lens and positioning the photosensitive sensor along a photosensitive path of the optical lens.

In one embodiment, the manufacturing method the camera module further comprises a step of:
providing a circuit arrangement in a support body to form the electrical support.

In one embodiment, the manufacturing method the camera module further comprises a step of:
forming laminated resin on a reinforcing member, such as reinforcing steel plate or a copper plate, to form a first support member, a second support member and a through hole, wherein the first support member and the second support member are integrally connected to form the support body.

In one embodiment, the circuit arrangement is embedded in the support body.

In one embodiment, the circuit arrangement comprises a plurality of conductors and a plurality of electrical components, wherein the conductors are embedded in the support body and is electrically connected with the electrical components.

In one embodiment, the manufacturing method of the camera module further comprises a step of:
providing a plurality of photosensitive sensor conductive members on the surface of the support body, so that the circuit arrangement and the photosensitive sensor are electrically connected.

In one embodiment, the manufacturing method of the camera module further comprises the steps of:
providing a plurality of driver conductive members on the surface of the support body;
coupling the optical lens with a driver to form a zoom camera module; and
coupling the driver on the electrical support and electrically connecting the circuit arrangement with the driver via at least one driver conductive member.

In one embodiment, the manufacturing method of the camera module further comprises the steps of:
forming a plurality of flexible PCB conductive members on the surface of the support body; and coupling the flexible PCB on the electrical support and electrically connecting the circuit arrangement and the flexible PCB through the flexible PCB conductive members.

In one embodiment, the photosensitive sensor is provided on the electrical support, wherein the electrically connecting method of the photosensitive sensor and the circuit arrangement is selected from the ACP (anisotropic conductive paste) and soldering.

In one embodiment, the flexible PCB is provided on the electrical support, wherein the electrically connecting method of the flexible PCB and the circuit arrangement is selected from the ACP (anisotropic conductive paste) and soldering.

In one embodiment, the driver is provided on the electrical support, wherein the electrically connecting method of the driver and the circuit arrangement is selected from the ACP (anisotropic conductive paste) and soldering.

In one embodiment, the photosensitive sensor is attached to the electrical support, wherein the electrically connecting method is selected ACP (anisotropic conductive paste), ultrasonic welding, thermo-compression bonding and reflow soldering.

In one embodiment, the flexible PCB is attached to the electrical support, wherein the electrically connecting method is selected ACP (anisotropic conductive paste), ultrasonic welding, thermo-compression bonding and reflow soldering.

In one embodiment, the driver is attached to the electrical support, wherein the electrically connecting method is selected ACP (anisotropic conductive paste), ultrasonic welding, thermo-compression bonding and reflow soldering.

In one embodiment, the manufacturing method of the camera module further comprises the steps of:

providing a plurality of electrical conductive members on the surface of the support body; and providing a plurality of electrical components on the electrical support, wherein the electrical components are electrically connected to the circuit arrangement by the electrical conductive members.

In one embodiment, the electrical components are attached to the electrical support, wherein the electrically connecting method is soldering.

In one embodiment, each of the electrical components is at least one of resistors, capacitors, and the driver elements in one or several.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1:
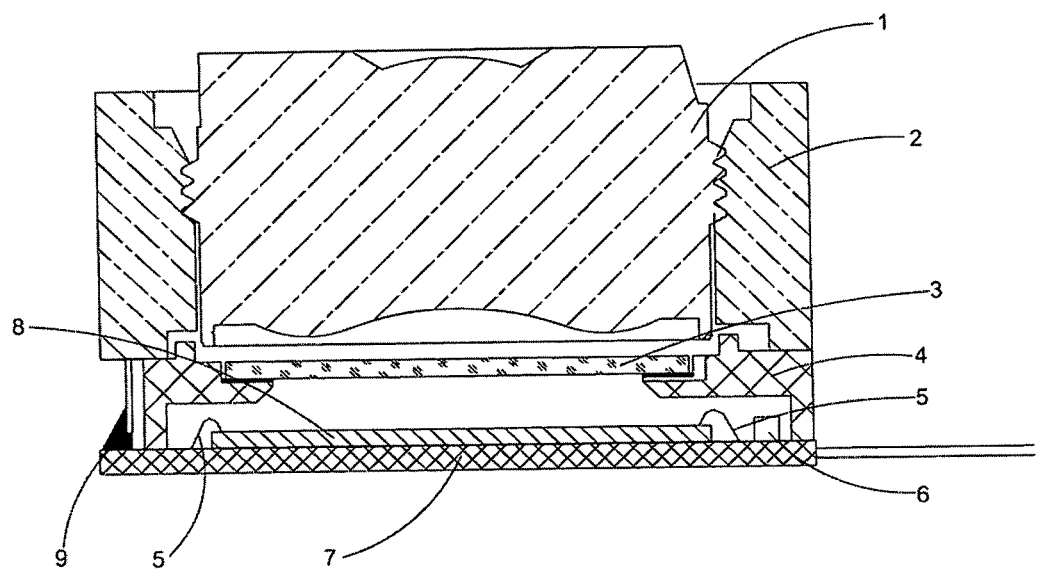
FIG. 1 illustrates a conventional camera module.
Figure 2:
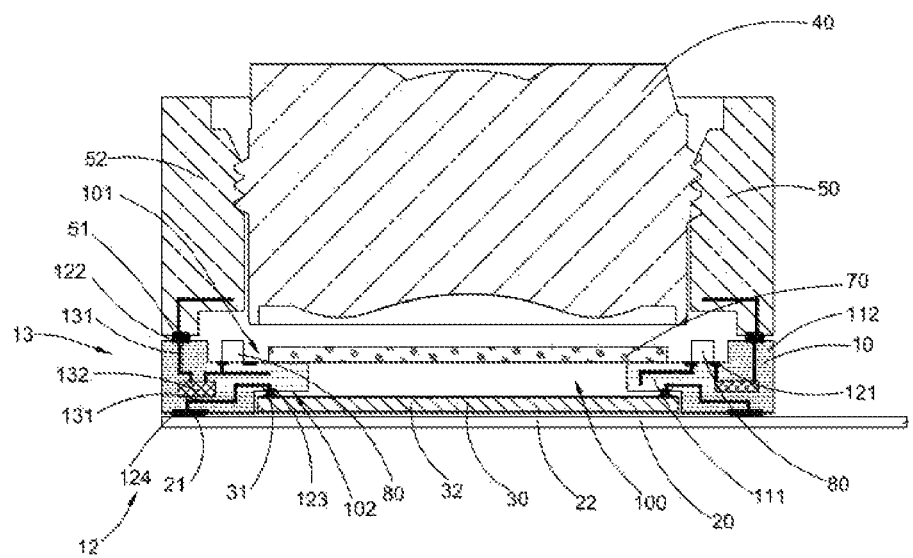
FIG. 2 is a sectional view of a camera module according to a preferred embodiment of the present invention.
Figure 3:
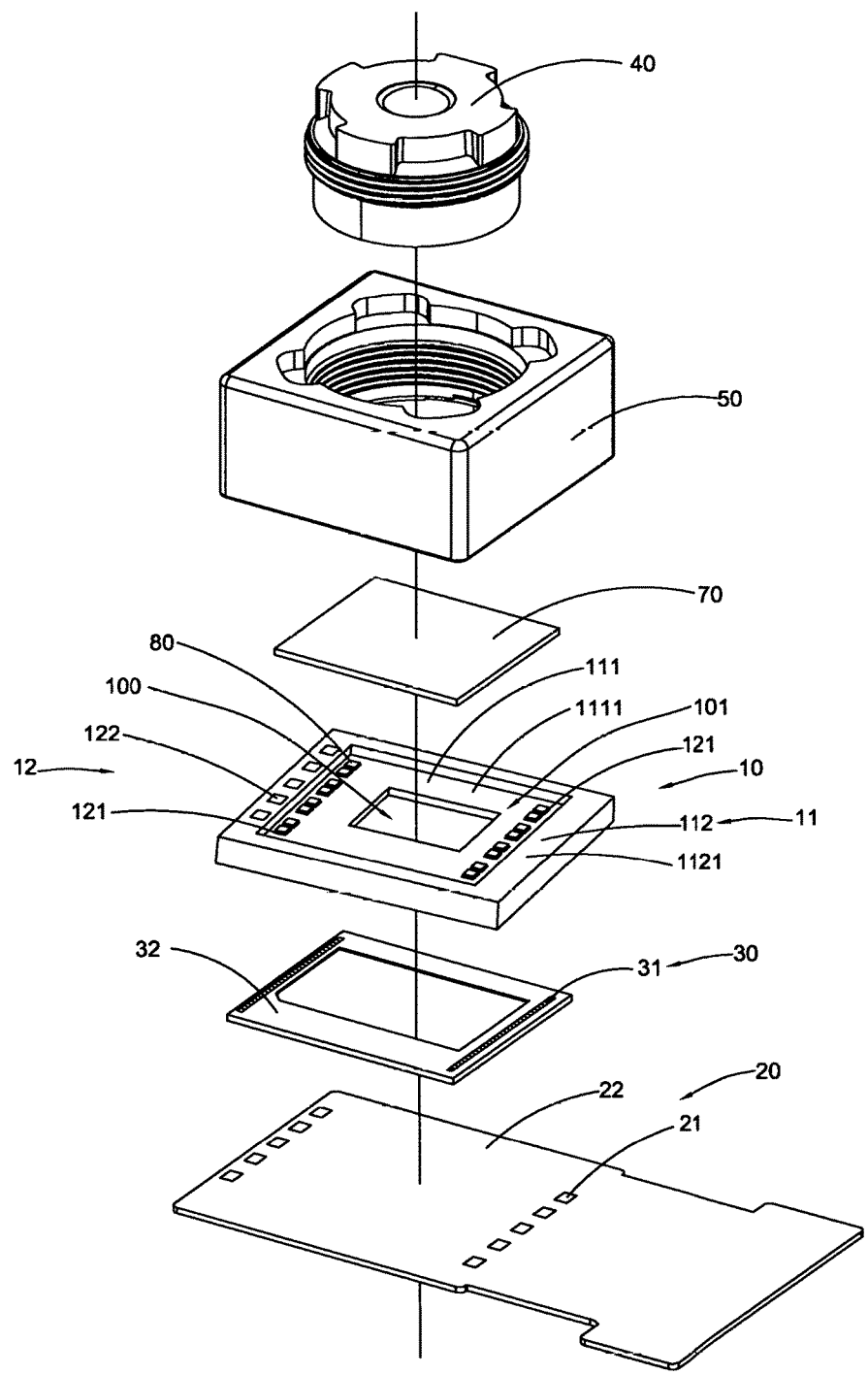
FIG. 3 is an exploded perspective view of the camera module according to the above preferred embodiment of the present invention.

Referring to FIGS. 2 and 3, a system level camera module according to a preferred embodiment of the present invention is illustrated. The camera module comprises am electrical support 10, a flexible PCB 20, a photosensitive sensor 30 such as a photosensitive chip, an optical lens 40 and a driver 50 such as a motor. It is worth mention that the driver 50 serves as a focusing mechanism, such that the system level camera module of the present invention can be an auto-focus camera module. The camera module of the present invention can also function without the driver 50, so that the camera module is a fixed focus camera module.

The optical lens 40 is mounted at the driver 50, and the optical lens 40 can be driven by the driver 50 for automatically focusing. The optical lens 40 is located along the photosensitive path of the photosensitive sensor 30, so that when the camera module is operated for capturing image, the light reflected by the object can be further accepted by the photosensitive sensor 30 for photoelectric conversion after passing through the optical lens 40. According to the preferred embodiment of the present invention, the electrical support 10 is connected with the flexible PCB 20 and the driver 50. In other words, the electrical support 10 serves as an integration of a base and a PCB in a conventional camera module, wherein the electrical support 10 forms an assembling means for connecting the driver 50 and the optical lens 40 and forms an electrical connection means for electrically connecting to the driver 50, the photosensitive sensor 30 and the flexible PCB 20 with each other.

Figure 4A:
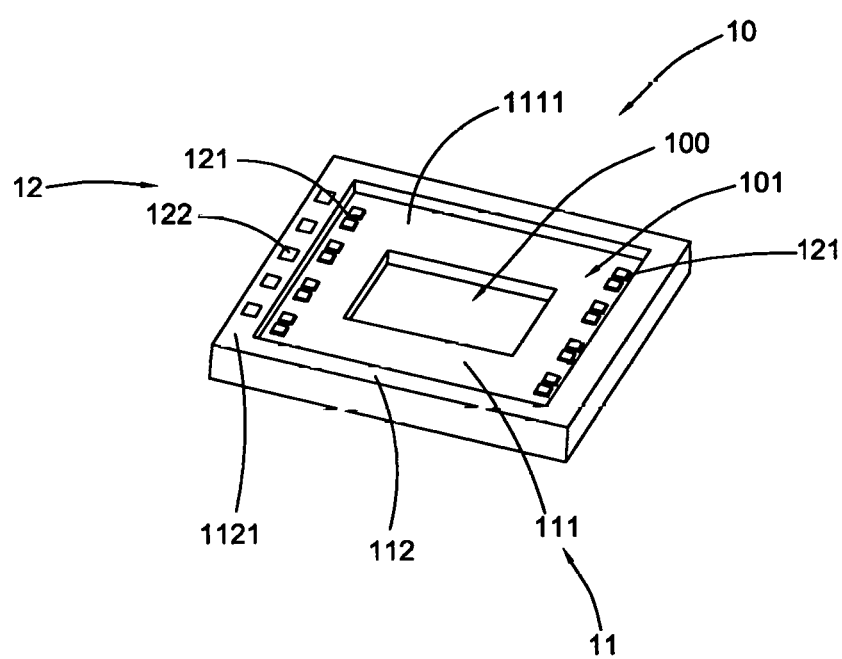
FIGS. 4A and 4B illustrate an electrical support of the camera module according to the above preferred embodiment of the present invention.
Figure 4B:
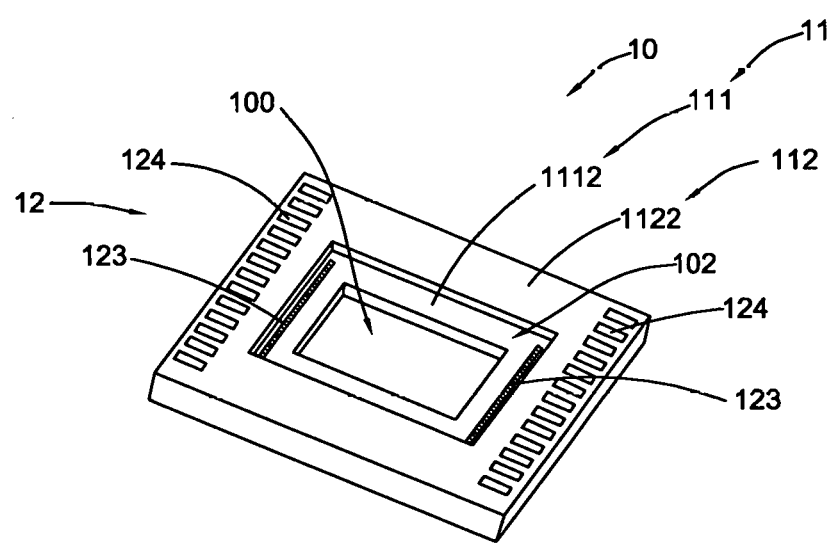

Referring to FIGS. 4A and 4B, the electrical support 10 further comprises a support body 11, one or more connecting members 12, a circuit arrangement 13, and a through hole 100. According to the preferred embodiment of the present invention, the support body 11 further comprises a first support member 111 defining the through hole 100 therein and a second support member 112, wherein the first support member 111 is indented from the second support member 112. For understanding easily, one portion of the support body 11 is defined as the first support member 111 and another portion of the support body 11 is defined as the second member 112. In fact, the first support member 111 and the second member 112 are integrated with each other during the manufacturing process. The support body 11 has a first top surface 1111, a first bottom surface 1112, a second top surface 1121 at a level higher than the first top surface 1111, and a second bottom surface 1122 at a level lower than the first bottom surface 1112. Specifically, the first top surface 1111 and the first bottom surface 1112 are defined at the first support member 111 of the support body 11, while the second top surface 1121 and the second bottom surface 1122 are defined at the second support member 112 of the support body 11. The circuit arrangement 13 is provided on the support body 11. Specifically, the circuit arrangement 13 is embedded in the support body 11.

The circuit arrangement 13 comprises a plurality of electrical conductors 131 and a plurality of electronic elements 132, wherein the electrical conductors 131 are pre-connected with the electronic elements 132 in an electrically connecting manner. The circuit arrangement 13 is pre-connected at the support body 11 to electrically connect with the driver 50, the flexible PCB 20 and the photosensitive sensor 30, so that each camera component of the camera module is electrically connected with each other in a pre-determined method to make the camera module having a preset function. The connecting member 12 is electrically connected with the electrical conductors 131 and the electronic elements 132, wherein the electronic elements 132 can be a variety of resistors, capacitors or driver components.

The photosensitive sensor 30 is coupled on the support body 11 of the electrical support 10 and is electrically connected with the circuit arrangement 13 and the flexible PCB 20. Specifically, the light-sensitive 30 is mounted on the flexible PCB 20, wherein the photosensitive sensor 30 is electrically connected to the flexible PCB 20 by the circuit arrangement 13 of the electrical support 10.

According to the preferred embodiment of the present invention, the camera module further comprises a plurality of electric components 80 which can be a variety of resistors, capacitors or driver components, and all these electric components can be protruded from the first top surface 1111. One skilled in the art can understand that the camera module comprises a plurality of electric components 80 is exemplary only and not intended to be limiting. In real practical application, the electronic elements and the electric components can be provided embedding in the electrical support 10, and also can be provided on and protruded from the surface of the electrical support 10.

The connecting member 12 is provided on the support body 11 and electrically connected with the photosensitive sensor 30, the driver 50 and the flexible PCB 20 of the camera module. Specifically, the connecting member 12 can be provided on different surfaces of the support body 11, which can be the first top surface 1111, the first bottom surface 1112, the second top surface 1121 and the second bottom surface 1122, so that the photosensitive sensor 30, the driver 50 and the flexible PCB 20 are electrically connected with each other respectively. More specifically, the connecting member 12 comprises a plurality of electric component conductive members 121, a plurality of driver conductive members 122, a plurality of photosensitive sensor conductive members 123 and a plurality of flexible PCB conductive members 124 which are used to connect and conduct the electric components 80, and the driver 50, the photosensitive sensor 30 and the flexible PCB 20 respectively.

The electric component conductive members 121, the driver conductive members 122, the photosensitive sensor conductive members 123 and the flexible PCB conductive members 124 are all alignedly provided on the surfaces of the support body 11, which are the first top surface 1111, the first bottom surface 1112, the second top surface 1121 and the second bottom surface 1122. More specifically, the electric component conductive members 121 are provided on the first top surface 1111, such that the electric component 80 can be easily provided on the first top surface 1111 and electrically connected with the circuit arrangement 13 of the electrical support 10. The driver conductive members 122 are provided on the second top surface 1121 for easily providing the driver 50 on the second top surface 1121 and electrically connecting with the circuit arrangement 13 of the electrical support 10. The photosensitive sensor conductive members 123 are provided on the first bottom surface 1112 for easily providing the photosensitive sensor 30 on the first bottom surface 1112 and electrically connecting with the circuit arrangement 13 of the electrical support 10. The flexible PCB conductive members 124 are provided on the second bottom surface 1122 for easily providing the flexible PCB 20 on the second bottom surface 1122 and electrically connecting with the circuit arrangement 13 of the electrical support 10.

The driver conductive members 122 are used to electrically connect the driver 50 with the circuit arrangement 13, so that the driver 50 can be actuated to further drive the optical lens 40 for adjustment of the camera module.

The photosensitive sensor conductive members 123 are electrically connected with the circuit arrangement 13. The flexible PCB conductive members 124 are electrically connected with the circuit arrangement 13. The photosensitive sensor 30 comprises a plurality of photosensitive sensor conductive elements 31 and a photosensitive sensor body 32, wherein the photosensitive sensor conductive elements 31 are provided on the photosensitive sensor body 32. It is worth mentioning that the positions of the photosensitive sensor conductive elements 31 on the photosensitive sensor body 32 are corresponding to the locations of the photosensitive sensor conductive members 123 on the electrical support 10. When the photosensitive sensor 30 is mounted on the electrical support 10, the photosensitive sensor 30 is electrically connected to the circuit arrangement 13 of the electrical support 10, and further electrically connected with the flexible PCB 20. Preferably, the photosensitive sensor 30 is mounted on the electrical support 10 using flip chip method and without wire bonding process, wherein the connecting method of photosensitive sensor conductive elements 31 and the photosensitive sensor conductive members 123 can be but not limited to ACP (anisotropic conductive paste), ultrasonic welding, thermo-compression bonding, reflow soldering, and etc.

The flexible PCB 20 comprises a plurality of PCB conductive elements 21 and a PCB body 22, wherein the PCB conductive elements 21 are alignedly provided on the PCB body 22. It is worth mentioning that the locations of the PCB conductive elements 21 on the PCB body 22 are corresponding to the locations of the PCB conductive members 124 on the electrical support 10. When the flexible PCB 10 is mounted on the electrical support 10, the flexible PCB 20 is electrically connected with the circuit arrangement 13 of the electrical support 10, and further electrically connected with the photosensitive sensor 30 and the driver 50. More specifically, the PCB conductive elements 21 are electrically connected with the PCB conductive members 124 of the electrical support 10, the electrical connecting method can be but not limited to soldering.

It is worth mentioning that the division of the flexible PCB 20 and the electrical support 10 is exemplary only and not intended to be limiting. According to other preferred embodiment of the present invention, the flexible PCB 20 can be integral with the electrical support 10. In addition, the flexible PCB 20 and the electrical support can be provided as an integral or separated according to the demands.

The driver 50 comprises a plurality of driver conductive elements 51 and a driver body 52, wherein the driver conductive elements 51 are provided on the driver body 52. It is worth mentioning that the locations of the driver conductive elements 51 on the driver body 52 are corresponding to the locations of the driver conductive members 122 on the electrical support 10. When the driver 50 is mounted on the electrical support 10, the driver 50 is electrically connected with the circuit arrangement 13 of the electrical support 10, and further electrically connected with the flexible PCB 20. More specifically, the driver conductive elements 51 are electrically connected with the driver conductive members 122 of the electrical support 10, wherein the electrical connection method can be but not limited to ACP (anisotropic conductive paste), ultrasonic welding, thermo-compression bonding, reflow soldering, and etc.

According to the preferred embodiment of the present invention, the connecting member 12 is embodied as a terminal which is the same part in conventional camera module to reduce the manufacturing cost of the camera module. Specifically, each of the electric component conductive members 121 is embodied as an electric component terminal. Each of the driver conductive members 122 is embodied as a driver terminal. Each of the photosensitive sensor conductive members 123 is embodied as a photosensitive sensor terminal. Each of the flexible PCB conductive members 124 is embodied as a flexible PCB terminal. It is worth mentioning that, according to the preferred embodiment of the present invention, each of the connecting members 12 can also be embodied as a soldering pad. One skilled in art can understand that using the soldering pad is exemplary only and not intended to be limiting. According to other embodiment of the present invention, the connecting members 12 can also embodied as any other possible method to achieve electrical conduction.

Referring to FIG. 3, the camera module 30 further comprises an optical filter 70 which is used to filter out stray light, in order to further enhance the quality of the image. The first top surface 1111 is indented from the second top surface 1121 to provide a top storing and protective space for the electric component 80 and the optical filter 70. The first bottom surface 1112 is indented from the second bottom surface 1122 to also provide a bottom storing and protective space for the photosensitive sensor 30 and the flexible PCB 20.

Referring to FIGS. 2 and 3, the electrical support 10 is modified from a conventional PCB board in order to omit the base of the conventional camera module. The electrical support 10 has an integrally formed with PCB circuit, and provides a top recess 101 as the top storing and protective space, the through hole 100, and a bottom recess 102 as the bottom storing and protective space inside the electrical support 10 in this preferred embodiment, wherein the through hole 100 communicates with the top recess 101 and the bottom recess 102. The inner diameter of each of the top recess 101 and the bottom recess 102 is larger than that of the through hole 100, wherein the electrical support 10 has a stepped-down stair configuration on the top and the bottom. In other words, the first top surface 1111 and the second top surface 1121 formed a non-coplanar stepped surface to form the top recess 101, while the first bottom surface 1112 and the second bottom surface 1122 formed a non-coplanar stepped surface to form the bottom recess 102.

The electric component 80 and the optical filter 70 are provided at the top recess 101 of the electrical support 10, wherein the electrical support 10 is used to mount the optical filter 70. The photosensitive sensor 30 is provided at the bottom recess 102, wherein the outer top surface is connected with the first bottom surface 1111 of the electrical support 10 so that the photosensitive sensor 30 can use flip chip method to mount. One skilled in art can understand that the light travelling through the optical lens 40 will be filtered by the optical filter 70, and will then travels through the through hole 100 to reach the photosensitive sensor 30.

One skilled in art will understand that positions arrangement of the above mentioned electric component conductive members 121, the driver conductive members 122, the photosensitive sensor conductive members 123 and the flexible PCB conductive members 124, the configuration of the first top surface 1111 opposite to the second top surface 1121, together with the configuration of the first bottom surface 1112 opposite to the second bottom surface 1122 is exemplary only and not intended to be limiting. The invention includes all modifications encompassed within the spirit and scope of the present invention. According to other embodiments of the present invention, there might be other ways of setting up, such as the first top surface 1111 is on the same plane with the second top surface 1121.

Figure 5A:
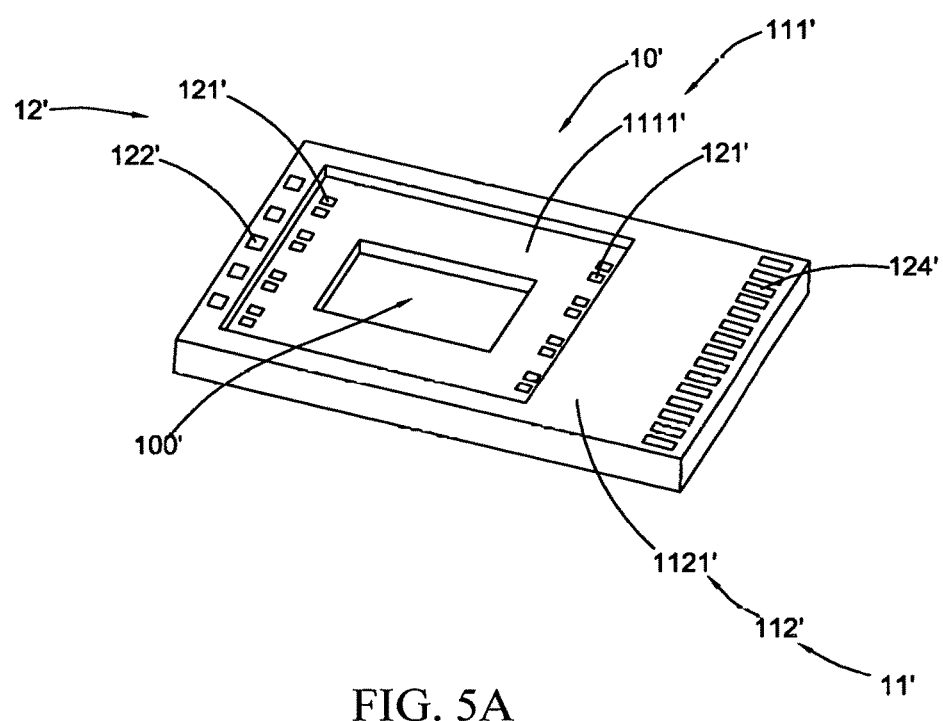
FIGS. 5A and 5B illustrate a first alternative mode of the electrical support of the camera module according to the above preferred embodiment of the present invention.
Figure 5B:
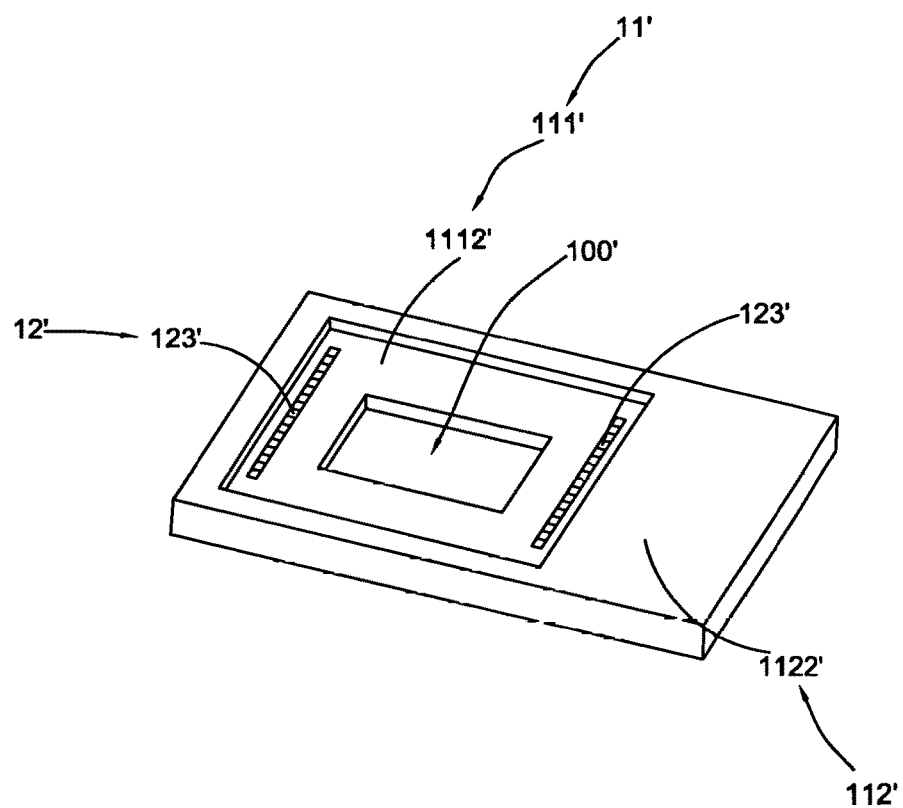

FIGS. 5A and 5B illustrate an alternative mode of an electrical support 10' according to the preferred embodiment of the present invention. Besides the electrical support 10', the structural configuration of the camera module of the first alternative of the preferred embodiment is the same as the preferred embodiment. As shown in the FIGS. 5A and 5B, the electrical support 10' comprises a support body 11', one or more connecting members 12' and a through hole 100'. According to the first alternative embodiment of the present invention, the support body 11' comprises a first support member 111' and a second support member 112', wherein the first support member 111' and the second support member 112' is integrally formed. The support body 11' has a first top surface 1111', a first bottom surface 1112', a second top surface 1121' and second bottom surface 1122'. Specifically, the first top surface 1111' and the first bottom surface 1112' are defined at the first support member 111' of the support body 11', while the second top surface 1121' and the second bottom surface 1122' are defined at the second support member 112' of the support body 11'. The circuit arrangement 13 is embedded in the support body 11'.

The connecting member 12' comprises a plurality of electric component conductive members 121', a plurality of driver conductive members 122', a plurality of photosensitive sensor conductive members 123' and a plurality of flexible PCB conductive members 124' for connecting and conducting the electric components 80, and the driver 50, the photosensitive sensor 30 and the flexible PCB 20 respectively.

The electric component conductive members 121' are provided on the first top surface 1111', while the driver conductive members 122' are provided on the second top surface 1121'. The flexible PCB conductive members 124' are provided on the second top surface 1121', while the photosensitive sensor conductive member 123' are provided on the first bottom surface 1112'. The first top surface 1111' is indented from the second top surface 1121'. The first bottom surface 1112' is indented from the second bottom surface 1122'.

Figure 6A:
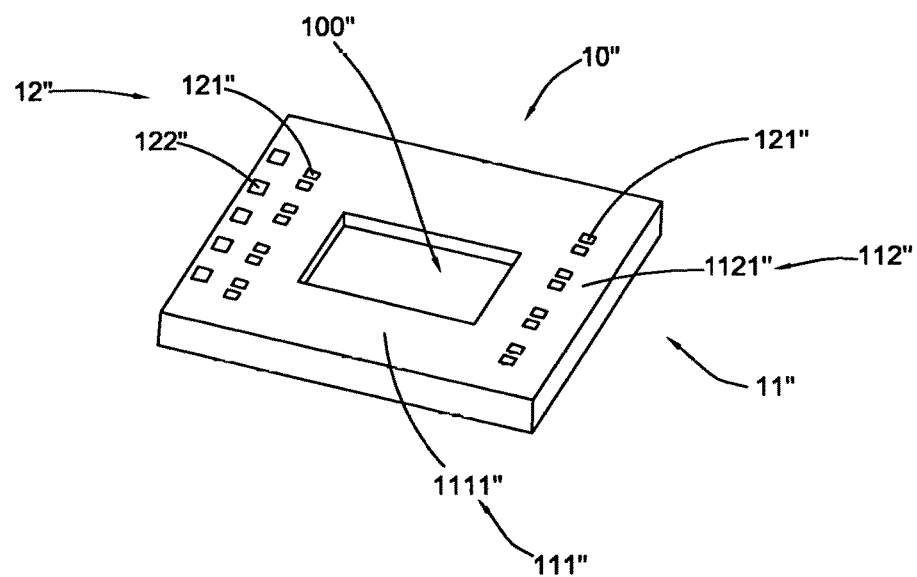
FIGS. 6A and 6B illustrate a second alternative mode of the electrical support of the camera module according to the above preferred embodiment of the present invention.
Figure 6B:
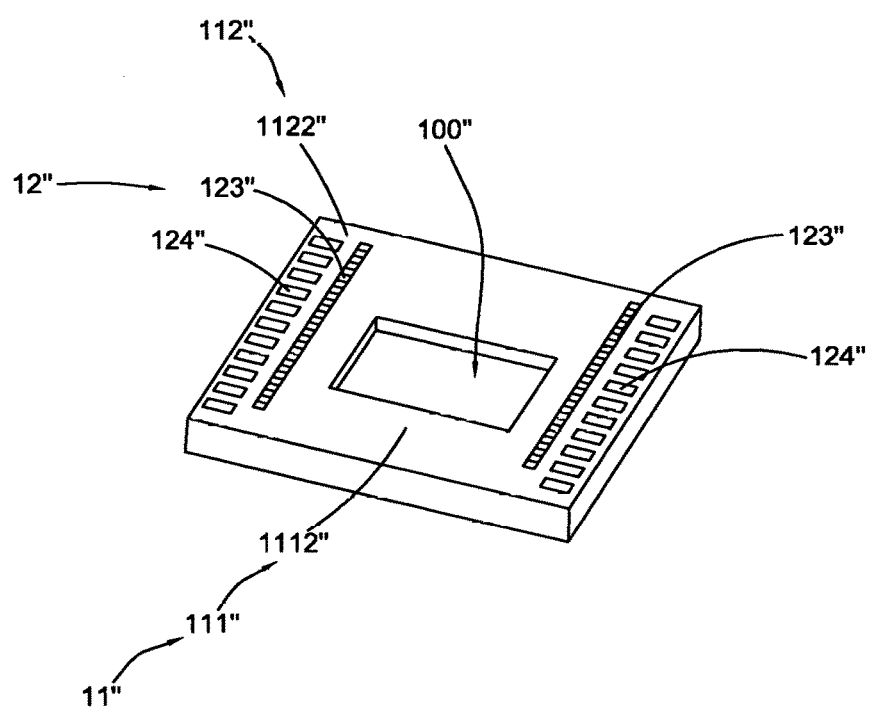

FIGS. 6A and 6B illustrate a second alternative mode of an electrical support 10" of the camera module according to the preferred embodiment of the present invention. Besides the electrical support 10", the structural configuration of the camera module according to the second alternative is the same as the preferred embodiment. As shown in FIGS. 6A and 6B, the electrical support 10" comprises a support body 11", one or more connecting members 12" and a through hole 100". According to the second alternative embodiment of the present invention, the support body 11" comprises a first support member 111" and a second support member 112", wherein the first support member 111" and the second support member 112" is integrally formed. The support body 11" has a first top surface 1111", a first bottom surface 1112", a second top surface 1121" and second bottom surface 1122". Specifically, the first top surface 1111" and the first bottom surface 1112" are defined at the first support member 111" of the support body 11", while the second top surface 1121" and the second bottom surface 1122" are defined at the second support member 112" of the support body 11". The circuit arrangement 13 is embedded in the support body 11".

The connecting member 12" comprises a plurality of electric component conductive members 121", a plurality of driver conductive members 122", a plurality of photosensitive sensor conductive members 123" and a plurality of flexible PCB conductive members 124" for connecting and conducting the electric components 80, and the driver 50, the photosensitive sensor 30 and the flexible PCB 20 respectively.

The electric component conductive members 121" are provided on the first top surface 1111". The driver conductive members 122" are provided on the second top surface 1121". The flexible PCB conductive member 124" is provided on the second top surface 1121". The photosensitive sensor conductive members. 123" are provided on the first bottom surface 1112". The first top surface 1111" is on the same plane with the second top surface 1121", which form an integral top surface at the same level. The first bottom surface 1112" is on the same plane with the second bottom surface 1122", which form an integral bottom surface at the same level. The photosensitive sensor 30 is mounted on the bottom of the electrical support 10" using flip chip method.

Figure 7A:
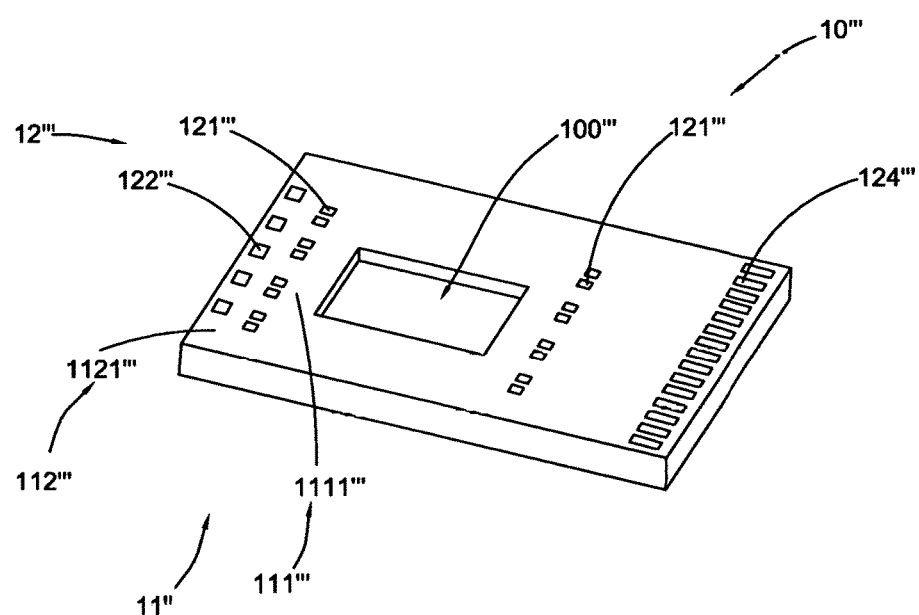
FIGS. 7A and 7B illustrate a third alternative mode of the electrical support of the camera module according to the above preferred embodiment of the present invention.
Figure 7B:
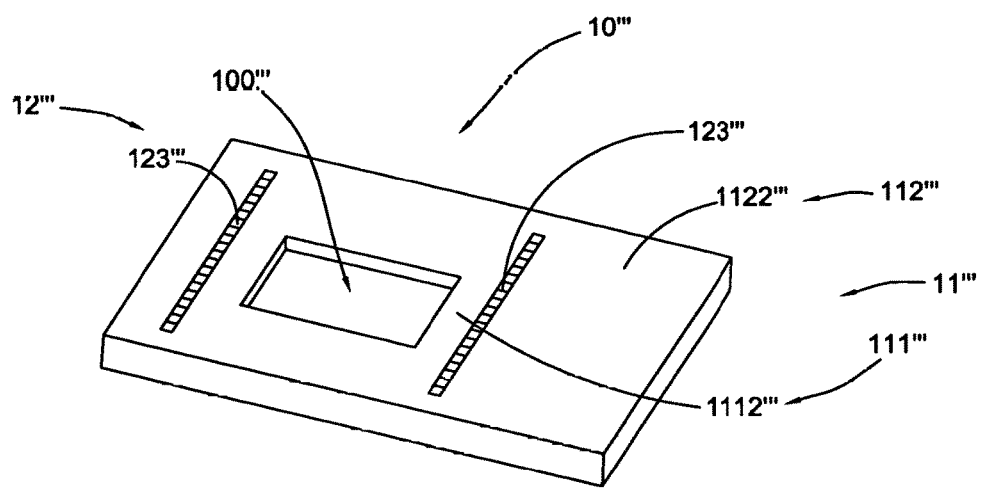

FIGS. 7A and 7B illustrate a third alternative mode of an electrical support 10" of the camera module according to the preferred embodiment of the present invention. Besides the electrical support 10''', the structural configuration of the camera module according to the third alternative is the same as the preferred embodiment. As shown in FIGS. 7A and 7B, the electrical support 10''' comprises a support body 11''', one or more connecting members 12''' and a through hole 100'''. According to the third alternative embodiment of the present invention, the support body 11''' comprises a first support member 111''' and a second support member 112''', wherein the first support member 111''' and the second support member 112''' is integrally formed. The support body 11''' has a first top surface 1111''', a first bottom surface 1112''', a second top surface 1121''' and second bottom surface 1122'''. Specifically, the first top surface 1111''' and the first bottom surface 1112''' are defined at the first support member 111''' of the support body 11''', while the second top surface 1121''' and the second bottom surface 1122''' are defined at the second support member 112''' of the support body 11'''. The circuit arrangement 13 is embedded in the support body 11'''.

The connecting member 12''' comprises a plurality of electric component conductive members 121''', a plurality of driver conductive members 122''', a plurality of photosensitive sensor conductive members 123''' and a plurality of flexible PCB conductive members 124''' for connecting and conducting the electric components 80, and the driver 50, the photosensitive sensor 30 and the flexible PCB 20 respectively.

The electric component conductive members 121''' are provided on the first top surface 1111'''. The driver conductive members 122''' are provided on the second top surface 1121'''. The photosensitive sensor conductive members 123''' are provided on the first bottom surface 1112'''. The flexible PCB conductive members 124''' are provided on the second bottom surface 1122'''. The first top surface 1111''' is on the same plane with the second top surface 1121''', which form an integral top surface at the same level. The first bottom surface 1112''' is on the same plane with the second bottom surface 1122''', which form an integral bottom surface at the same level. The photosensitive sensor 30 is mounted on the bottom of the electrical support 10''' using flip chip method.

In the overall structural scheme, the present invention has some new features over the conventional COB package as the following.

1. For the camera module serving as an autofocus camera module, when the driver is mounted to the electrical support, the electrical property of both parts is conducted by the driver soldering pad and the driver conductive member. The conductive method could be soldering, and preferably using conductive silver paste. Thus after the mounting of the driver, no further soldering process is needed.

2. The optical filter is mounted on the surface of the electrical support instead of attaching to an interior of the lens or a separate base.

3. The photosensitive sensor is mounted to the electrical support by using flip chip method. And the wire bonding process could be omitted. For example, the connecting method of the photosensitive sensor conductive element 31 and the photosensitive sensor conductive member 123 could be but not limited to ACP (anisotropic conductive paste), ultrasonic welding, thermo-compression bonding, reflow soldering, and etc.

4. More than one set of conductive point is provided on the outside of the electrical support, such as (1) the driver conductive soldering pad, (2) the flexible conductive soldering pad, and (3) the photosensitive sensor conductive soldering pad inside the electrical support.

5. Resistors, capacitors and driver IC can be embedded into the electrical support with predetermined shape, thus the design of the electrical support is flexible.

Figure 8A:
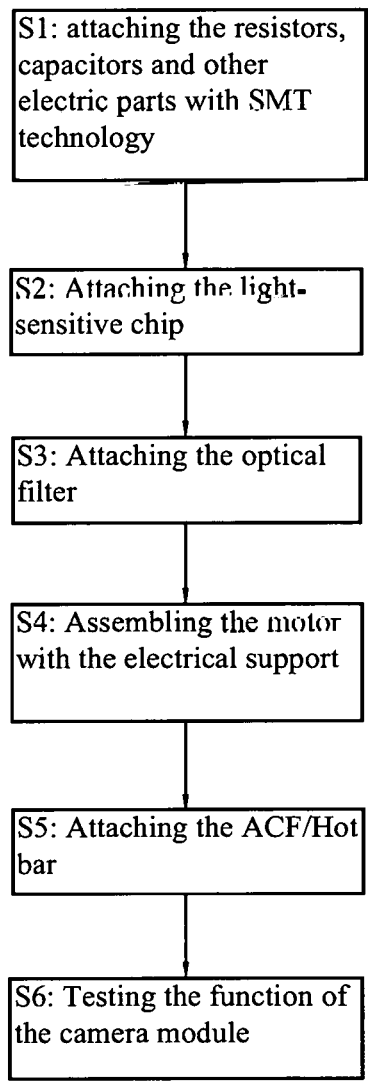
FIGS. 8A and 8B illustrate a manufacturing method of the camera module according to the present invention.
Figure 8B:
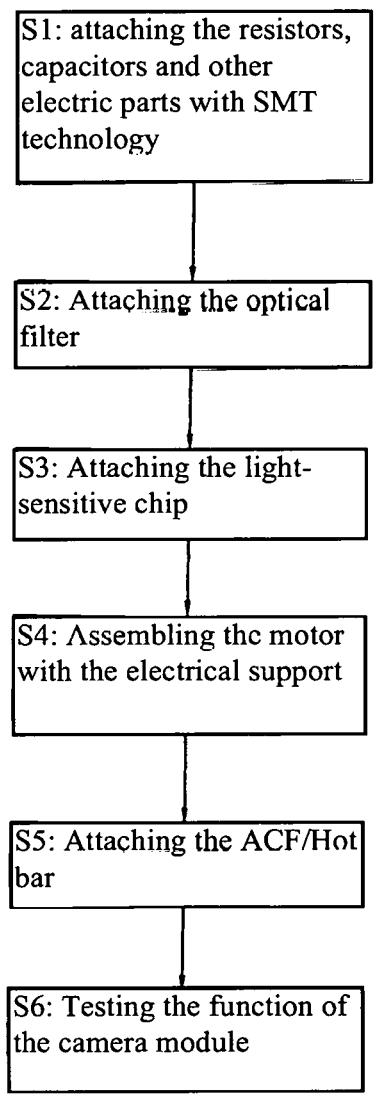

Referring to FIGS. 8A and 8B, a manufacturing method of a electrical support according to present invention is illustrated. As shown in FIGS. 8A and 8B, the manufacturing method of the camera module comprises the following steps.

S1: installing the resistors, capacitors and other electric components with SMT technology;

S2: installing the photosensitive sensor;

S3: intalling the optical filter;

S4: assembling the driver with the electrical support;

S5: installing the ACF/Hot bar; and

S6: testing the function of the camera module.

Wherein in the step S1, SMT refers to surface mount technology. Specifically, this step is the step to integrally form the electrical support 10, 10', 10", 10''' in the embodiment and its alternatives.

Step S2 refers to a step of installing the photosensitive sensor to the electrical support 10, 10', 10", 10''' in the embodiment and its alternatives.

Step S3 refers to a step of installing the optical filter to the electrical support 10, 10', 10", 10''' in the embodiment and its alternatives.

Step S4 refers to a step of installing the driver to the electrical support 10, 10', 10", 10''' in the embodiment and its alternatives. One skilled in the art will understand for those fixed focal camera module which does not equipped with a driver, the step S4 could be omitted. Alternatively, the optical lens 40 is mounted to the electrical support 10 directly.

In step S5, the ACF refers to Anisotropic Conductive Adhesive. The Hot bar refers to a pulse heating reflow soldering heating head which is used to solder related electric parts. Specifically, the step S5 refers to a step of electrically connecting the electric component 80, the photosensitive sensor 30, the optical filter 70 and/or the driver 50 to the electrical support 10, 10', 10", 10"' in the embodiment and its alternatives, the connecting method could be but not limited to ACP (anisotropic conductive paste) and soldering.

Step S6 refers to a step of functional test of the assembled camera module which is formed from the previous steps.

It is worth mentioning that the step S2 and the step S3 are interchangeable.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
   an optical lens;
   a photosensitive sensor, wherein said optical lens is positioned along an photosensitive path of said photosensitive sensor;
   an electrical support, which comprises:
   a support body that supports said optical lens, wherein said support body has a first top surface and a second top surface at level higher than said first top surface to form a step-down stair configuration,
   a circuit arrangement, which comprises a plurality of electrical conductors and a plurality of electronic elements which are electrically connected to each other, integrally embedded in said support body and conductively connected with said photosensitive sensor, and
   a connecting member comprising a plurality of photosensitive sensor conductive members formed on a surface of said support body provided at said support body and electrically connected with said circuit arrangement, wherein said photosensitive sensor is coupled with said support body at a position within said support body and electrically connected to said photosensitive sensor conductive members to electrically connect with said circuit arrangement, whereby said support body forms a circuit board to electrically connect with said photosensitive sensor and serves as a base to support said photosensitive sensor;
   a PCB, wherein said connecting member further comprises a plurality of PCB conductive members formed on said surface of said support body and electrically connected to said PCB, so as to electrically connect said PCB with said circuit arrangement;
   a driver coupling with said optical lens, wherein said connecting member further comprises a plurality of driver conductive members formed on said surface of said support body and electrically connected to said driver, so as to electrically connect said driver with said circuit arrangement; and
   an electric component mounted on the first top surface of said support body and a plurality of electric component conductive members formed on said first top surface of said support body and electrically connected to said electric component with said circuit arrangement, wherein said electric component conductive members are formed on said first top surface and said driver conductive members are formed on said second top surface of said support body.

2. The camera module, as recited in claim 1, wherein said support body further has a first bottom surface to form a step-down stair configuration, wherein said photosensitive sensor conductive members are formed on said first bottom surface and said PCB conductive members are formed on said second bottom surface.

3. A method of manufacturing of a camera module, comprising the steps of:
   (a) forming an electrical support by the steps of:
   (a.1) integrally embedding a circuit arrangement in a support body, wherein said circuit arrangement comprises a plurality of electrical conductors and a plurality of electronic elements which are pre-connected with said electrical conductors in an electrically connecting manner;
   (a.2) forming a plurality of photosensitive sensor conductive members on a surface of said support body and electrically connecting said photosensitive sensor conductive members with said circuit arrangement; and
   (a.3) forming a plurality of PCB conductive members on said surface of said support body and electrically connecting said PCB conductive members with said circuit arrangement;
   (b) supporting a photosensitive sensor within said support body and electrically connecting said photosensitive sensor within said support body and electrically connecting said photosensitive sensor to said photosensitive sensor conductive members, such that said support body forms a circuit board to electrically connect with said photosensitive sensor and serves as a base to support said photosensitive sensor;
   (c) providing a PCB which is electrically connected to said PCB conductive members so as to electrically connect said PCB with said circuit arrangement;
   (d) supporting an optical lens along a photosensitive path of said photosensitive sensor; and
   (e) supporting an optical filter at a top side of said electrical support while said photosensitive sensor is installed at a bottom side of said electrical support which has a through hole extended through said top and bottom sides, wherein said support body has a first top surface and a second top surface at a level higher than said first top surface to form a step-down stair configuration, wherein said electric component conductive members are formed on said first top surface and said driver conductive members are formed on said second top surface.

4. A method a manufacturing of a camera module, comprising the steps of:
   (a) forming an electrical support by the steps of:
   (a.1) integrally embedding a circuit arrangement in a support body, wherein said circuit arrangement comprises a plurality of electrical conductors and a plurality of electronic elements which are pre-connected with said electrical conductors in an electrically connecting manner;
   (a.2) forming a plurality of photosensitive sensor conductive members on a surface of said support body and electrically connecting said photosensitive sensor conductive members with said circuit arrangement;

(a.3) forming a plurality of PCB conductive members on said surface of said support body and electrically connecting said PCB conductive members with said circuit arrangement; and (a.4) forming a plurality of driver conductive members on said surface of said support body;

(b) supporting a photosensitive sensor within said support body and electrically connecting said photosensitive sensor to said photosensitive sensor conductive members, such that said support body forms a circuit board to electrically connect with said photosensitive sensor and serves as a base to support said photosensitive sensor;

(c) providing a PCB which is electrically connected to said PCB conductive members so as to electrically connect said PCB with said circuit arrangement;

(d) supporting an optical lens along a photosensitive path of said photosensitive sensor and providing a driver that couples with said optical lens, said plurality of driver conductive members formed on said surface of said support body electrically connecting said driver conducive members to said driver, so as to electrically connect said driver with said circuit arrangement; and (e) supporting an optical filter at a top side of said electrical support while said photosensitive sensor is installed at a bottom side f said electrical support which has a through hole extended through said top and bottom sides, wherein said support body has first top surface and a second top surface at a level higher than said first top surface to form a step-down stair configuration, wherein said electric component conductive members are formed on said first top surface and said driver conductive members are formed on said second top surface.

* * * * *